United States Patent
Gharibdoust et al.

(10) Patent No.: US 11,742,861 B2
(45) Date of Patent: Aug. 29, 2023

(54) CLOCK AND DATA RECOVERY LOCK DETECTION CIRCUIT FOR VERIFYING LOCK CONDITION IN PRESENCE OF IMBALANCED EARLY TO LATE VOTE RATIOS

(71) Applicant: KANDOU LABS SA, Lausanne (CH)

(72) Inventors: Kiarash Gharibdoust, Lonay (CH); Ali Hormati, Ecublens Vaud (CH)

(73) Assignee: KANDOU LABS SA, Lausanne (CH)

( * ) Notice: Subject to any disclaimer, the term of this patent is extended or adjusted under 35 U.S.C. 154(b) by 0 days.

(21) Appl. No.: 17/937,197

(22) Filed: Sep. 30, 2022

(65) Prior Publication Data

US 2023/0013802 A1 Jan. 19, 2023

Related U.S. Application Data

(63) Continuation of application No. 17/220,786, filed on Apr. 1, 2021, now Pat. No. 11,463,092.

(51) Int. Cl.
| | |
|---|---|
| H03L 7/08 | (2006.01) |
| H03K 19/21 | (2006.01) |
| H03L 7/089 | (2006.01) |
| H03L 7/197 | (2006.01) |

(52) U.S. Cl.
CPC ........... *H03L 7/0807* (2013.01); *H03K 19/21* (2013.01); *H03L 7/0891* (2013.01); *H03L 7/197* (2013.01)

(58) Field of Classification Search
CPC ... H03L 7/0807; H03L 7/0891; H03L 7/0197; H03K 17/21; H04L 7/033; H04L 7/0337; H04L 7/02; H04L 7/04

USPC .................................................. 375/375, 376
See application file for complete search history.

(56) References Cited

U.S. PATENT DOCUMENTS

| | | | |
|---|---|---|---|
| 4,839,907 | A | 6/1989 | Saneski |
| 5,266,907 | A | 11/1993 | Dacus |
| 5,302,920 | A | 4/1994 | Bitting |
| 5,528,198 | A | 6/1996 | Baba et al. |
| 5,565,817 | A | 10/1996 | Lakshmikumar |

(Continued)

FOREIGN PATENT DOCUMENTS

| | | |
|---|---|---|
| CN | 203675093 U | 6/2014 |
| EP | 0740423 A2 | 10/1996 |
| JP | 3615692 B2 | 11/2004 |

OTHER PUBLICATIONS

International Search Report and Written Opinion for PCT/US2022/022873, dated Jul. 20, 2022, 1-12 (12 pages).

(Continued)

*Primary Examiner* — Hai L Nguyen (57) ABSTRACT

Methods and systems are described for generating early and late votes for a clock recovery system, each early or late vote associated with a detected transitional data pattern in a data stream, generating a first early-late vote measurement reflective of an imbalance between the early and late votes that are generated during a first time interval, generating a second early-late vote measurement reflective of an imbalance between the early and late votes that are generated during a second time interval, comparing the first and the second early-late vote measurements, and outputting a CDR-lock signal at least in part responsive to determining that the first and the second early-late vote measurements are within a predetermined threshold.

20 Claims, 6 Drawing Sheets

(56) References Cited

U.S. PATENT DOCUMENTS

| | | | |
|---|---|---|---|
| 5,602,884 A | 2/1997 | Wieczorkiewicz et al. |
| 5,629,651 A | 5/1997 | Mizuno |
| 5,802,356 A | 9/1998 | Gaskins et al. |
| 6,002,717 A | 12/1999 | Gaudet |
| 6,026,134 A | 2/2000 | Duffy et al. |
| 6,037,812 A | 3/2000 | Gaudet |
| 6,122,336 A | 9/2000 | Anderson |
| 6,307,906 B1 | 10/2001 | Tanji et al. |
| 6,316,987 B1 | 11/2001 | Dally et al. |
| 6,380,783 B1 | 4/2002 | Chao et al. |
| 6,389,091 B1 | 5/2002 | Yamaguchi et al. |
| 6,426,660 B1 | 7/2002 | Ho et al. |
| 6,507,544 B1 | 1/2003 | Ma et al. |
| 6,509,773 B2 | 1/2003 | Buchwald et al. |
| 6,633,621 B1 | 10/2003 | Bishop et al. |
| 6,650,699 B1 | 11/2003 | Tierno |
| 6,717,478 B1 | 4/2004 | Kim et al. |
| 6,838,951 B1 | 1/2005 | Nieri et al. |
| 6,917,762 B2 | 7/2005 | Kim |
| 7,078,978 B2 | 7/2006 | Wakii |
| 7,102,449 B1 | 9/2006 | Mohan |
| 7,158,441 B2 | 1/2007 | Okamura |
| 7,199,728 B2 | 4/2007 | Dally et al. |
| 7,336,112 B1 | 2/2008 | Sha et al. |
| 7,532,697 B1 | 5/2009 | Sidiropoulos et al. |
| 7,535,957 B2 | 5/2009 | Ozawa et al. |
| 7,616,075 B2 | 11/2009 | Kushiyama |
| 7,650,525 B1 | 1/2010 | Chang et al. |
| 7,688,929 B2 | 3/2010 | Co |
| 7,697,647 B1 | 4/2010 | McShea |
| 7,822,113 B2 | 10/2010 | Tonietto et al. |
| 7,839,229 B2 | 11/2010 | Nakamura et al. |
| 7,852,109 B1 | 12/2010 | Chan et al. |
| 7,860,190 B2 | 12/2010 | Feller |
| 8,036,300 B2 | 10/2011 | Evans et al. |
| 8,253,454 B2 | 8/2012 | Lin |
| 8,407,511 B2 | 3/2013 | Mobin et al. |
| 8,583,072 B1 | 11/2013 | Ciubotaru et al. |
| 8,649,476 B2 | 2/2014 | Malipatil et al. |
| 8,791,735 B1 | 7/2014 | Shibasaki |
| 8,929,496 B2 | 1/2015 | Lee et al. |
| 9,036,764 B1 | 5/2015 | Hossain et al. |
| 9,059,816 B1 | 6/2015 | Simpson et al. |
| 9,306,621 B2 | 4/2016 | Zhang et al. |
| 9,374,250 B1 | 6/2016 | Musah et al. |
| 9,397,868 B1 | 7/2016 | Hossain et al. |
| 9,438,409 B1 | 9/2016 | Liao et al. |
| 9,520,883 B2 | 12/2016 | Shibasaki |
| 9,565,036 B2 | 2/2017 | Zerbe et al. |
| 9,577,815 B1 | 2/2017 | Simpson et al. |
| 9,602,111 B1 | 3/2017 | Shen et al. |
| 9,906,358 B1 | 2/2018 | Tajalli |
| 9,960,902 B1 | 5/2018 | Lin et al. |
| 10,055,372 B2 | 8/2018 | Shokrollahi |
| 10,326,435 B2 | 6/2019 | Arp et al. |
| 10,488,227 B2 | 11/2019 | Amiri et al. |
| 10,574,487 B1 | 2/2020 | Hormati |
| 10,848,351 B2 | 11/2020 | Hormati |
| 11,463,092 B1 * | 10/2022 | Gharibdoust ......... H04L 7/0004 |
| 2003/0001557 A1 | 1/2003 | Pisipaty |
| 2003/0146783 A1 | 8/2003 | Bandy et al. |
| 2003/0212930 A1 | 11/2003 | Aung et al. |
| 2003/0214977 A1 | 11/2003 | Kuo |
| 2004/0092240 A1 | 5/2004 | Hayashi |
| 2004/0141567 A1 | 7/2004 | Yang et al. |
| 2005/0024117 A1 | 2/2005 | Kubo et al. |
| 2005/0078712 A1 | 4/2005 | Voutilainen |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0141662 A1 | 6/2005 | Sano et al. |
| 2005/0201491 A1 | 9/2005 | Wei |
| 2005/0220182 A1 | 10/2005 | Kuwata |
| 2005/0275470 A1 | 12/2005 | Choi |
| 2006/0008041 A1 | 1/2006 | Kim et al. |
| 2006/0062058 A1 | 3/2006 | Lin |
| 2006/0140324 A1 | 6/2006 | Casper et al. |
| 2006/0232461 A1 | 10/2006 | Felder |
| 2007/0001713 A1 | 1/2007 | Lin |
| 2007/0001723 A1 | 1/2007 | Lin |
| 2007/0047689 A1 | 3/2007 | Menolfi et al. |
| 2007/0058768 A1 | 3/2007 | Werner |
| 2007/0086267 A1 | 4/2007 | Kwak |
| 2007/0127612 A1 | 6/2007 | Lee et al. |
| 2007/0146088 A1 | 6/2007 | Arai et al. |
| 2007/0147559 A1 | 6/2007 | Lapointe |
| 2007/0183552 A1 | 8/2007 | Sanders et al. |
| 2007/0201597 A1 | 8/2007 | He et al. |
| 2007/0253475 A1 | 11/2007 | Palmer |
| 2008/0007367 A1 | 1/2008 | Kim |
| 2008/0111634 A1 | 5/2008 | Min |
| 2008/0136479 A1 | 6/2008 | You et al. |
| 2008/0165841 A1 | 7/2008 | Wall et al. |
| 2008/0181289 A1 | 7/2008 | Moll |
| 2008/0219399 A1 | 9/2008 | Nary |
| 2008/0317188 A1 | 12/2008 | Staszewski et al. |
| 2009/0103675 A1 | 4/2009 | Yousefi et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0243679 A1 | 10/2009 | Smith et al. |
| 2009/0262876 A1 | 10/2009 | Arima et al. |
| 2009/0262877 A1 | 10/2009 | Shi et al. |
| 2010/0033259 A1 | 2/2010 | Miyashita |
| 2010/0090723 A1 | 4/2010 | Nedovic et al. |
| 2010/0090735 A1 | 4/2010 | Cho |
| 2010/0156543 A1 | 6/2010 | Dubey |
| 2010/0180143 A1 | 7/2010 | Ware et al. |
| 2010/0220828 A1 | 9/2010 | Fuller et al. |
| 2011/0002181 A1 | 1/2011 | Wang et al. |
| 2011/0025392 A1 | 2/2011 | Wu et al. |
| 2011/0148498 A1 | 6/2011 | Mosalikanti et al. |
| 2011/0234278 A1 | 9/2011 | Seo |
| 2011/0311008 A1 | 12/2011 | Slezak et al. |
| 2012/0051480 A1 | 3/2012 | Usugi et al. |
| 2012/0170621 A1 | 7/2012 | Tracy et al. |
| 2012/0200364 A1 | 8/2012 | Iizuka et al. |
| 2012/0206177 A1 | 8/2012 | Colinet et al. |
| 2012/0235717 A1 | 9/2012 | Hirai et al. |
| 2012/0327993 A1 | 12/2012 | Palmer |
| 2013/0088274 A1 | 4/2013 | Gu |
| 2013/0091392 A1 | 4/2013 | Valliappan et al. |
| 2013/0093471 A1 | 4/2013 | Cho et al. |
| 2013/0107997 A1 | 5/2013 | Chen |
| 2013/0108001 A1 | 5/2013 | Chang et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2014/0286457 A1 | 9/2014 | Chaivipas |
| 2015/0043627 A1 | 2/2015 | Kang et al. |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0256326 A1 | 9/2015 | Simpson et al. |
| 2016/0056980 A1 | 2/2016 | Wang et al. |
| 2016/0087610 A1 | 3/2016 | Hata |
| 2016/0134267 A1 | 5/2016 | Adachi |
| 2017/0005785 A1 | 1/2017 | Aleksic et al. |
| 2017/0228215 A1 | 8/2017 | Chatwin et al. |
| 2017/0310456 A1 | 10/2017 | Tajalli |
| 2018/0083763 A1 | 3/2018 | Black et al. |
| 2018/0219539 A1 | 8/2018 | Arp et al. |
| 2018/0227114 A1 | 8/2018 | Rahman et al. |
| 2018/0343011 A1 | 11/2018 | Tajalli et al. |
| 2018/0375693 A1 | 12/2018 | Zhou et al. |
| 2019/0109735 A1 | 4/2019 | Norimatsu |
| 2019/0377378 A1 | 12/2019 | Gharibdoust |

(56) References Cited

U.S. PATENT DOCUMENTS

2020/0162233 A1   5/2020   Lee et al.
2021/0248103 A1   8/2021   Khashaba et al.

OTHER PUBLICATIONS

Chang, Hong-Yeh, et al., "A Low-Jitter Low-Phase-Noise 10-GHz Sub-Harmonically Injection-Locked PLL With Self-Aligned DLL in 65-nm CMOS Technology", IEEE Transactions on Microwave Theory and Techniques, vol. 62, No. 3, Mar. 2014, 543-555 (13 pages).

Cui, Delong, et al., "A Dual-Channel 23-Gbps CMOS Transmitter/ Receiver Chipset for 40-Gbps RZ-DQPSK and CS-RZ-DQPSK Optical Transmission", IEEE Journal of Solid-State Circuits, vol. 47, No. 12, Dec. 2012, 3249-3260 (12 pages).

Ha, J.C., et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Inti, Rajesh, et al., "A 0.5-to-2.5 GB/s Reference-Less Half-Rate Digital CDR with Unlimited Frequency Acquisition Range and Improved Input Duty-Cycle Error Tolerance", IEEE Journal of Solid-State Circuits, vol. 46, No. 12, Dec. 2011, 3150-3162 (13 pages).

Loh, Mattew, et al., "A 3x9 GB/s Shared, All-Digital CDR for High-Speed, High-Density I/O", IEEE Journal of Solid-State Circuits, vol. 47, No. 3, Mar. 2012, 641-651 (11 pages).

Nandwana, Romesh Kumar, et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 882-895 (14 pages).

Ng, Herman Jalli, et al., "Low Phase Noise 77-GHz Fractional-N PLL with DLL-based Reference Frequency Multiplier for FMCW Radars", European Microwave Integrated Circuits Conference, Oct. 10-11, 2011, 196-199 (4 pages).

Pozzoni, Massimo, et al., "A Multi-Standard 1.5 to 10 GB/s Latch-Based 3-Tap DFE Receiver with a SSC Tolerant CDR for Serial Backplane Communication", IEEE Journal of Solid-State Circuits, vol. 44, No. 4, Apr. 2009, 1306-1315 (10 pages).

Riley, M. W., et al., "Cell Broadband Engine Processor: Design and Implementation", IBM Journal of Research and Development, vol. 51, No. 5, Sep. 2007, 545-557 (13 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Shu, Guanghua, et al., "A 4-to-10.5 GB/s Continuous-Rate Digital Clock and Data Recovery With Automatic Frequency Acquisition", IEEE Journal of Solid-State Circuits, vol. 51, No. 2, Feb. 2016, 428-439 (12 pages).

Tajalli, Armin, "Wideband PLL Using Matrix Phase Comparator", Journal of Latex Class Files, vol. 14, No. 8, Aug. 2016, 1-8 (8 pages).

Tan, Han-Yuan, "Design of Noise-Robust Clock and Data Recovery Using an Adaptive-Bandwidth Mixed PLL/DLL", Harvard University Thesis, Nov. 2006, 1-169 (169 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

Yoo, Danny, et al., "A 36-GB/s Adaptive Baud-Rate CDR with CTLE and 1-Tap DFE in 28-nm CMOS", IEEE Solid-State Circuits Letters, vol. 2, No. 11, Nov. 2019, 252-255 (4 pages).

Zaki, Ahmed M., "Adaptive Clock and Data Recovery for Asymmetric Triangular Frequency Modulation Profile", IEEE Pacific Rim Conference on Communications, Computers and Signal Processing (PACRIM), Aug. 21, 2019, 1-6 (6 pages).

* cited by examiner

CLOCK AND DATA RECOVERY LOCK DETECTION CIRCUIT FOR VERIFYING LOCK CONDITION IN PRESENCE OF IMBALANCED EARLY TO LATE VOTE RATIOS

CROSS-REFERENCE TO RELATED APPLICATIONS

This application is a continuation of U.S. application Ser. No. 17/220,786, filed Apr. 1, 2021, entitled "Clock and Data Recovery Lock Detection Circuit for Verifying Lock Condition in Presence of Imbalanced Early to Late Vote Ratios", naming Kiarash Gharibdoust, which is hereby incorporated by reference herein in its entirety for all purposes.

REFERENCES

The following prior applications are herein incorporated by reference in their entirety for all purposes:

U.S. patent application Ser. No. 16/274,118, filed Jun. 12, 2019, naming Kiarash Gharibdoust, entitled "Low Latency Combined Clock Data Recovery Logic Network and Charge Pump Circuit", hereinafter identified as [Gharibdoust].

BACKGROUND

It is common for communications receivers to extract a receive clock signal from the received data stream. Some communications protocols facilitate such Clock Data Recovery (CDR) operation by constraining the communications signaling so as to distinguish between clock-related and data-related signal components. Similarly, some communications receivers process the received signals beyond the minimum necessary to detect data, so as to provide the additional information to facilitate clock recovery. As one example, a so-called double-baud-rate receive sampler may measure received signal levels at twice the expected data reception rate (i.e. utilizing two distinct time samples per receive unit interval,) to allow independent detection of the received signal level corresponding to the data component, and the chronologically offset received signal transition related to the signal clock component.

However, the introduction of extraneous communications protocol transitions limits achievable data communication rate. Similarly, receive sampling at higher than transmitted data rate substantially increases receiver power utilization. Thus, a receive CDR system operating at baud rate (e.g. the receiver utilizing only a single time sample per receive unit interval) is desirable.

Data-dependent receive equalization is also well known in the art. Generally, these time-domain-oriented equalization methods focus on compensating for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. In DFE, the time-domain oriented equalization is performed by maintaining a history of previously-received data values at the receiver, which are processed by a transmission line model to predict the expected influence that each of the historical data values would have on the present receive signal. Such a transmission line model may be pre-calculated, derived by measurement, or generated heuristically, and may encompass the effects of one or more than one previous data interval. The predicted correction of the accumulated influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision of the prior unit interval is resolved.

[Gharibdoust] describes a data communication receiver incorporating at least one stage of unrolled DFE, thus for each receive unit interval a single clock signal initiates two concurrent samples, one representing the received data result if the previous unit interval was a one, and the other representing the received data result if the previous unit interval was a zero. Because of the speculated influence of the previous unit interval data, the sampling thresholds at which the two concurrent measurements are made are offset in amplitude. For certain sequences of received data, it is possible for a received signal transition to pass through a first sampler's threshold voltage at the sampling time, while a second sampler obtains a stable "center of eye" data result. Said first sampler response may be processed to obtain an indication whether the actual received signal transition was earlier or later than would be predicted relative to the receive clock, providing a correction signal that may be used to adjust the receive clock phase.

BRIEF DESCRIPTION

Methods and systems are described which identify whether a receive clock signal is properly locked in frequency and phase to a receive signal stream, permitting error-free data detection to occur. Following conventional practices, the frequency and phase of a receive clock is adjusted based on "early" or "late" error indications obtained by observing transitions in a received signal stream, said adjustments accumulating until the transition timing of the receive clock is sufficiently accurate to maintain data detection. Due to inherent processing biases within the receive clock system and/or intentional clock rate variations generated by the transmitting device, there may be a variation between the number of "early" error indications and the number of "late" error indications observed, even when the receive clock phase is accurately adjusted. Integration or accumulation of error indications over two or more time intervals may be used to determine whether the receive clock is locked, in one embodiment by observing that the accumulated error indications are within a predetermined range, in a second embodiment by observing that the ratios of error indicators are within a predetermined range, and in another embodiment by observing that consecutive accumulated error indications are similar.

Methods and systems are described herein for generating early and late votes for a clock recovery system, each early or late vote associated with a detected transitional data pattern in a data stream, generating a first early-late vote measurement reflective of an imbalance between the early and late votes that are generated during a first time interval, generating a second early-late vote measurement reflective of an imbalance between the early and late votes that are generated during a second time interval, comparing the first and the second early-late vote ratios, and outputting a CDR-lock signal at least in part responsive to determining that the first and the second early-late vote ratios are within a predetermined threshold.

DETAILED DESCRIPTION

In recent years, the signaling rate of high speed communications systems have reached speeds of tens of gigabits per second, with individual data unit intervals measured in picoseconds. Conventional practice for a high-speed integrated circuit receiver has each data line terminate (after any relevant front end processing such as amplification and frequency equalization) in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition.

Figure 1:
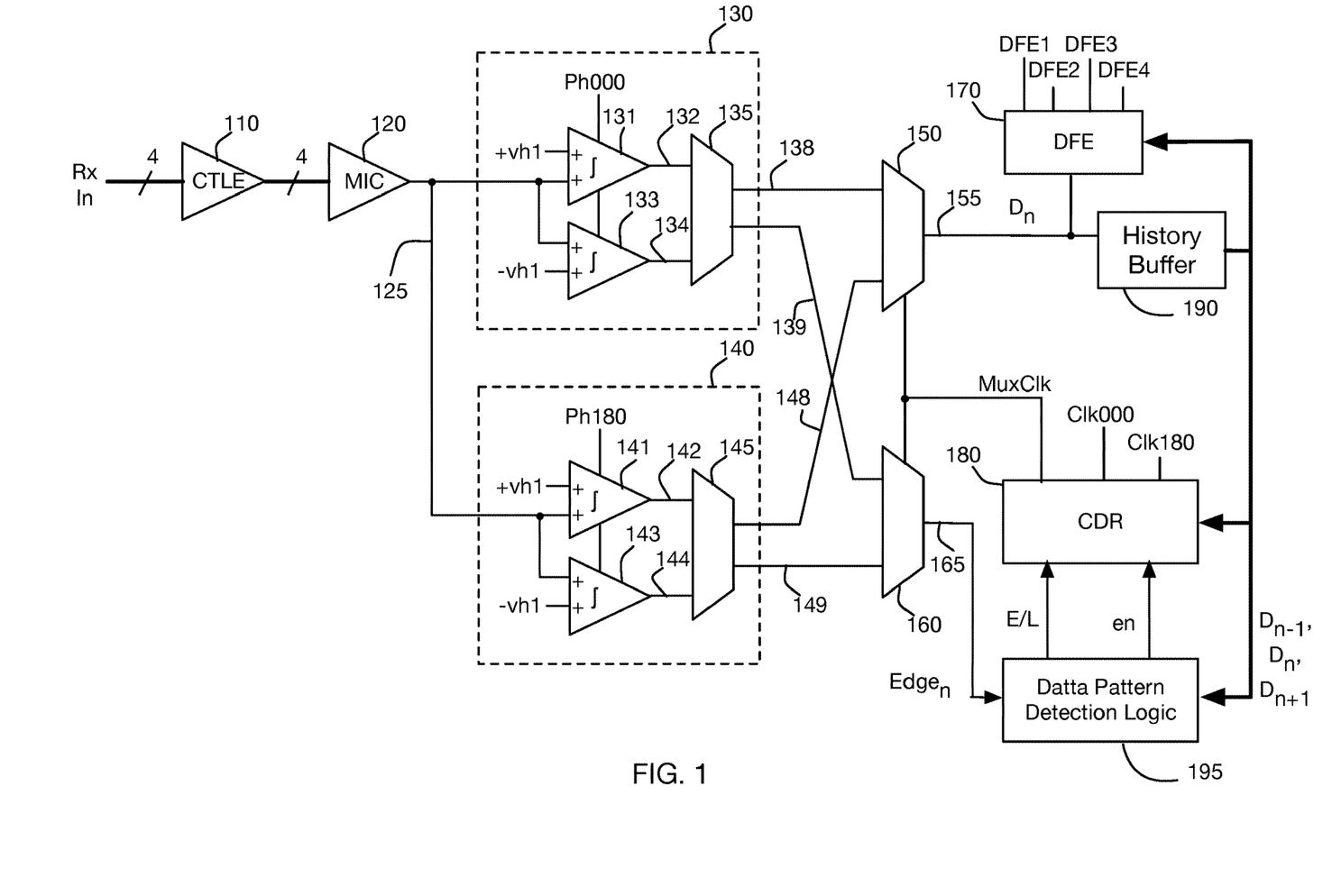
FIG. 1 is a block diagram of a high speed data communications receiver.

FIG. 1 illustrates a high-speed data receiver in accordance with some embodiments herein, in which input signals 'Rx in' undergo front end processing 110 and 120 before sampled using speculative samplers 131/133 and 141/143 in parallel processing phases 130 and 140 respectively, the parallel processing phases 130 and 140 operating on alternating receive unit intervals as depicted by sampling clocks ph000 and ph180, which may be derived from VCO clocks Clk000 and Clk180, respectively. It should be noted that the use of additional or fewer parallel processing phases may be adapted to the receiver of FIG. 1, e.g., FIG. 1 may be similarly composed of a single processing phase or additionally four (or more) parallel processing phases being interleaved by additional multiplexers similar to multiplexers 150 and 160.

As shown in the receiver of FIG. 1, samplers 131 and 133 of parallel processing phase 130 generate two samples: one generated according to the +vh1 threshold and one according to the −vh1 threshold. Once the data bit in the preceding interval is fully resolved, one of samples 132 and 134 is selected as a data decision 138 and is provided to multiplexer 150 while the other is selected as a potential edge sample candidate 139 (pending pattern verification) and provided to multiplexer 160. In some embodiments utilizing two parallel processing phases as shown in FIG. 1, the data decisions 138 and 148 may also be cross-communicated as selection inputs to multiplexers 145 and 135, respectively (not shown). In alternative embodiments, the selection inputs to multiplexers may be provided by another means, e.g., from history buffer 190. Samplers 141/143 generating outputs 142 and 144 and multiplexer 145 of parallel processing phase 140 operate similar to those of parallel processing phase 130.

Multiplexer 150 alternates between providing data decisions Dn 155 corresponding to data decisions 138 and 148 generated by parallel processing phases 130 and 140, respectively, according to MuxClk. The data decisions Dn 155 are stored in data history buffer 190 and may also have additional historical DFE correction applied by DFE correction circuit 170 which operates on historical data decisions provided by history buffer 190. Multiplexer 160 alternates between providing possible edge samples 139 and 149 from processing phases 130 and 140 as potential edge sample candidates $Edge_n$ 165 to CDR circuit 180, which is described in further detail with respect to FIGS. 2 and 5. The 'n' subscripts herein refer to the signaling interval for which the sample was taken. In some embodiments, pattern detection circuit 195 generates an early-late vote E/L based on $Edge_n$ and one or more data samples stored in history buffer 190 as well as a data pattern detection signal indicating that the early-late vote E/L is valid. The early-late vote E/L and the data pattern detection signal may be provided to the CDR 180 for updating the VCO.

Figure 3A:
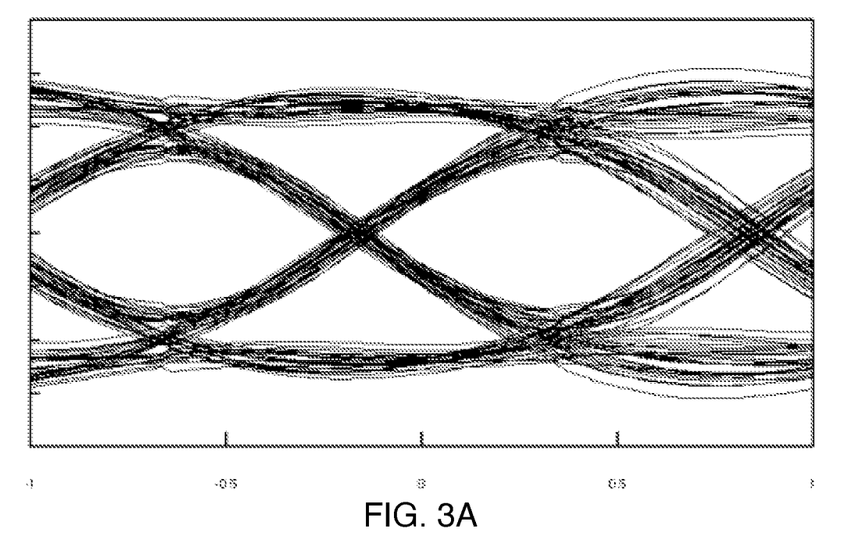
FIG. 3A shows typical received signals in a receiver utilizing one stage of unrolled DFE.

Subsequently, this document will use the term sampling device, or more simply "sampler" to describe this receiver component that generates the input measurement, as it implies both the time and amplitude measurement constraints, rather than the equivalent but less descriptive term "slicer" also used in the art. The well-known receiver "eye plot", an example of which is shown as FIG. 3A, graphically illustrates input signal values that will or will not provide accurate and reliable detected results from such measurement, and thus the allowable boundaries of the time- and amplitude-measurement windows imposed on the sampler.

Clock Data Recovery

So-called Clock Data Recovery or CDR circuits support such sampling measurements by extracting timing information, as one example from signal transitions on the data lines themselves and utilizing that extracted information to generate clock signals to control the time interval used by the data line sampling device(s). The actual clock generation may be performed using well known circuits such as a Phase Locked Loop (PLL) or Delay Locked Loop (DLL), which in their operation may also generate higher frequency internal clocks, multiple clock phases, etc. in support of receiver operation. The example embodiment of FIG. 2 uses a PLL composed of phase comparator 220, Low-pass filter 230, and voltage-controlled ring oscillator (VCO) 240.

Figure 2:
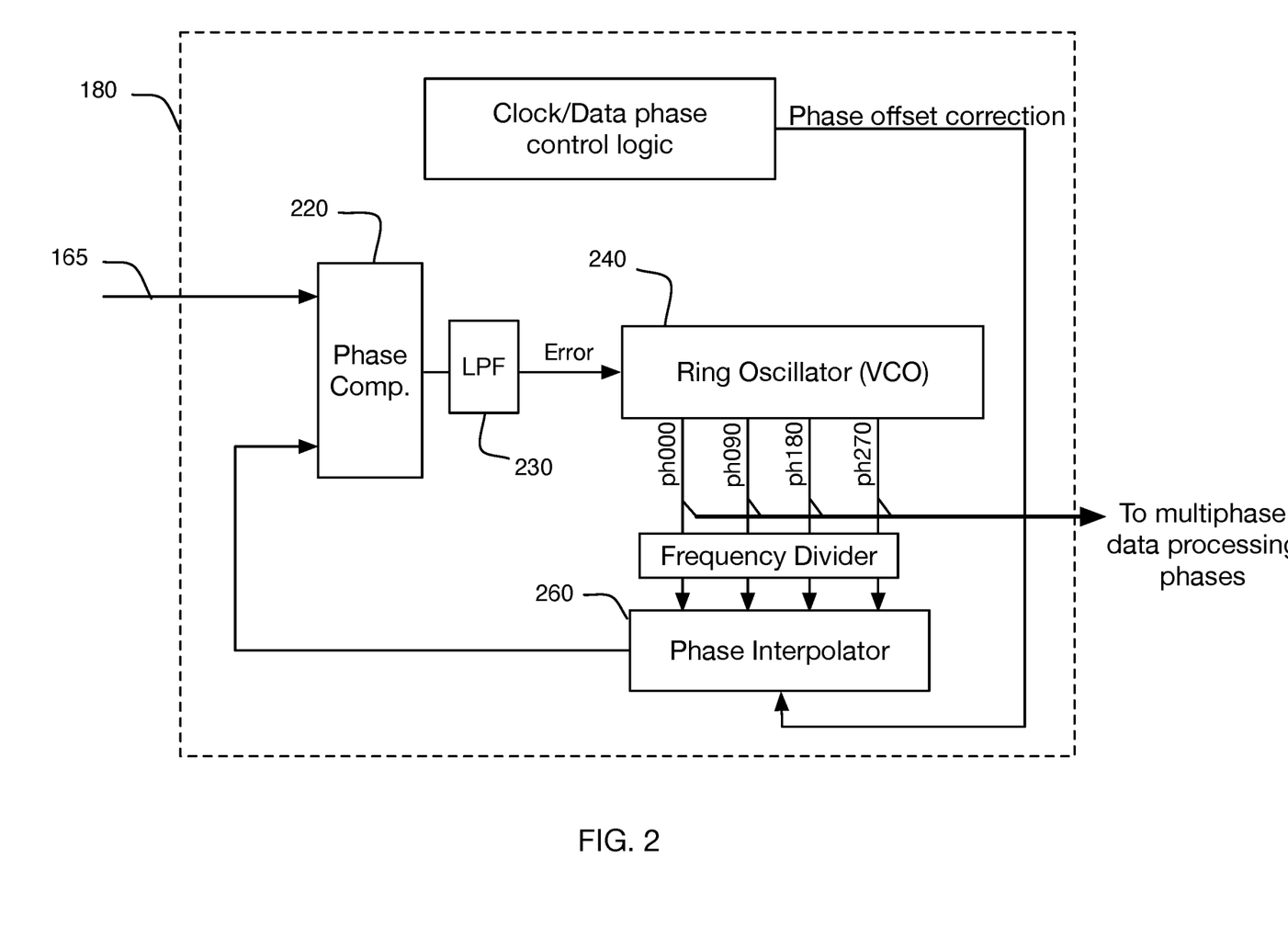
FIG. 2 is a block diagram of a Clock Data Recovery subsystem, as incorporated in the receiver of FIG. 1.

In some embodiments, CDR involves two interrelated operations; generation of a local clock signal having a known phase relationship with the received signal, and derivation of a properly timed sampling clock from that local clock. Such indirect synchronization may occur if the receiver operates at a different rate than the received data, as one example utilizing two alternating receive processing phases, each operating at one half the receive data rate. Furthermore, the naturally locked phase relationship between the signal used as an external phase reference and the local clock may be quite different from the desired sample clock timing, relative to that same local clock, thus requiring the sampling clock to be generated with a predetermined amount of phase offset. In the CDR of FIG. 2, this phase offset is controlled by phase interpolator 260.

As the optimum "center of open eye" data sampling point is difficult to measure directly, most systems instead initiate the data sampling operation at a predetermined delay or offset from the eye edge, i.e. when the input signal transitions between states. Typically, the steps associated with CDR include identification of suitable receive signal transitions, comparison of timing of said transitions with the local clock signal so as to produce a phase error signal, correction of the local clock signal using the phase error signal, and derivation of a properly timed sampling clock from the corrected local clock signal.

A CDR system may include a phase detector comparing the external timing reference with the local clock (e.g. the PLL's VCO output or a clock derived from its VCO output) to produce a phase error signal, a low-pass filter that smooths the phase error to produce a VCO control signal, and a voltage-controlled oscillator (VCO) producing a continuous clock oscillation at the controlled rate. Historically, such PLLs were implemented as closed loop analog systems, thus the frequency control of the VCO was an analog voltage derived from a low-pass filter operating on the (typically pulse-width-modulated) error results from the phase detector. This analog-oriented nomenclature persists without implying limitation, even though in some embodiments all or some of these circuit elements are fully digital designs and all or some of the control signals are digital values or signals.

Decision Feedback Equalization

It has become common practice for data communications receivers to incorporate Decision Feedback Equalization (DFE) to compensate for signal propagation anomalies in the communications medium. The DFE system performs time-domain oriented equalization on the received signal by maintaining a history of previously-received data values at the receiver, and processing those historic data values with a transmission line model to predict the expected influence each of the historical data values would have on the present receive signal. Such a transmission line model may be pre-calculated, derived by measurement, or generated heuristically, and may encompass the effects of one or more than one previous data interval. The predicted influence of these one or more previous data intervals is collectively called the DFE compensation, which is subsequently applied to the received signal to facilitate the current unit interval's detection. For purposes of explanation, this computation may be simply described as comprising multiplication of each previous unit interval's data value by a predetermined scaling factor or weight, with the summation of these scaled results producing a composite DFE compensation value representing the cumulative predicted effect of all such previous unit intervals.

In some receiver designs, this DFE compensation value will be subtracted from the current receive signal input, to produce a corrected signal more accurately representing the received data value. Such subtraction may be performed, as one example, by applying the received signal and the DFE compensation value to the inputs of a differential amplification circuit. In one common embodiment, this differential circuit represents the input of a digital comparator or a combined time- and amplitude-sampler, the output of which represents the detected data value relative to a particular speculative threshold level.

Those familiar with the art will recognize that the DFE compensation value produced as described above cannot be calculated until the previous unit interval's data value has been detected. Thus, as data rates increase, a point will be reached at which the information to produce the DFE compensation value is not available in time to be applied to the next unit interval sampling. Indeed, at the highest data rates currently used in practice, this situation may exist for multiple previous unit intervals, as the detection time for a single data value may represent multiple unit interval durations, requiring the receiver to pipeline or parallelize the detection operation. Thus, it is common for embodiments to forgo such "closed loop" DFE methods for one or more of the most recent unit intervals. Instead, such embodiments speculatively generate one or more elements of the DFE compensation value as "open loop" or "unrolled loop" operations. As one example, an embodiment described in [Gharibdoust] and incorporated here as FIG. 1 utilizes multiple simultaneously-clocked data detection samplers, each sampler provided with a distinct speculative value of DFE compensation associated with the possible detected data value for one or more previous unit intervals. In such an embodiment, selection of one of the speculative DFE compensation values may be postponed until after the current unit interval data detection, by storing the results of the various sampler outputs 132, 134, 142, 144 (which are dependent on different speculative DFE compensation values) and then later selecting via e.g., multiplexers 135 and 145 which stored output is to be used for data detection 138/148 and which output is a potential edge sample candidate 139/149.

Baud-Rate CDR in a Speculative DFE System

Figure 3B:
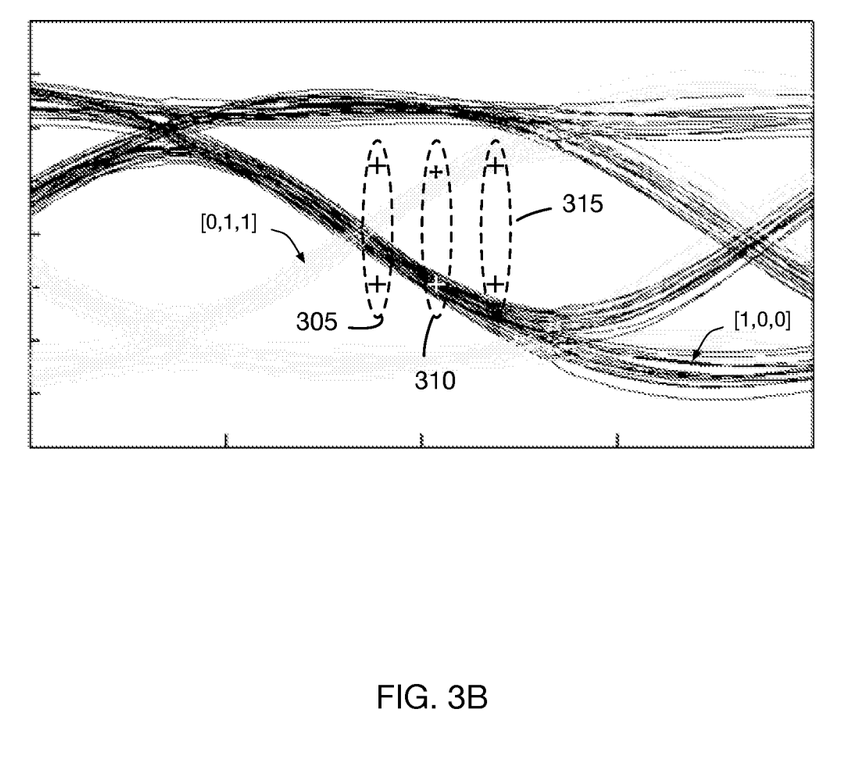
FIG. 3B illustrates use of the unrolled DFE samplers to obtain transition information.

Under some operating conditions, the "extra" unrolled DFE stored results not selected for data detection may provide timing information as to the relationship of the sampling clock and receive signal transitions. As described in [Gharibdoust] and shown here as FIG. 3B, the signal trajectory for some receive data patterns may pass through an unrolled DFE sampler threshold at its sampling time, while another DFE sampler measuring at a different threshold at the same sampling time detects a stable "center of open eye" data result. In FIG. 3B, this may be seen for samples 310, in which the upper sample (subsequently described as the data sampler) is taken in the center of the data eye, while the lower sampler (subsequently described as the edge sampler) intersects with the signal trajectory, in this example for a signal corresponding to a "1" previous data value, a "0" current value, and a "0" subsequent value, indicated in the illustration by the notation [1, 0, 0]. The value obtained by the edge sampler is dependent on the timing relationship between the sample clock and the data edge, as may be seen with samples 305 showing the clock occurring early relative to the data transition, and samples 315 showing the clock occurring late relative to the data transition. [Gharibdoust] describes an exemplary logic implementation that combines the signal trajectory information obtained from a data history buffer and the result obtained from the edge sampler to produce the desired "early" or "late" error indications.

Although this CDR technique utilizing only a single sampling clock for both clock and data recovery efficiently minimizes the number of samplers required and their inherent power consumption, it provides only intermittent clock phase correction signals, associated with arrival of the particular receive signal patterns to which it is sensitive. Referring to the previously-mentioned analog PLL example, such a phase detector would be enabled only for particular receive signal patterns, resulting in, as one example, a positive or negative pulse output from a phase detector/charge pump which incrementally increases or decreases the integrated signal stored in the low pass filter. Between these phase corrections, the phase detector/charge pump is inhibited, leaving the error voltage produced by the low pass filter unchanged; thus allowing the receive clock PLL to free-run at its last adjusted rate. As previously noted this description is not limiting, with multiple equivalent embodiments in both analog and digital realms known in the art.

PLL Lock Detection

During startup or after a prolonged absence of phase corrections, the PLL VCO frequency may be significantly offset from the proper receive clock rate and phase, making it impossible to properly detect receive data.

As an indication of this fault condition, a lock detection circuit may be used to report when a suitable receive clock is available and thus that the detected data results are reliable. Typically, such circuits observe the error signal controlling the VCO frequency, with a minimization of error signal variations (i.e. an unchanging low-pass filtered error voltage, in an analog PLL) indicating that the present VCO frequency is aligned with the received data stream. However, both intentional and unintentional anomalies may lead such a lock detector to produce false results. Capacitor leakage in the low-pass filter can cause the error signal to drift towards Vss and require periodic "pumping up", and imbalance between the "pump up" and "pump down" currents in the charge pump output of the phase detector can introduce asymmetric ramp variations in the steady state error voltage that may be mistaken for "lock hunting" behavior in the PLL.

Some lock detectors combine such error voltage monitoring with clock rate frequency measurement to minimize false lock reports during startup transients and eliminate false locking of the VCO to a fraction or a multiple of the desired frequency. However, even simple frequency measurements can also fail in subtle ways; if the receive clock is asynchronous or pleisochronous to the reference clock used by the counting operation, there can be count ambiguities caused by the arbitrary phase relationship between the beginning and end of the period being measured and the counting clock. Also, many communications systems now intentionally dither the clock frequency used by external signals to minimize peaks in the emitted radiation spectrum. Thus, the measured data rate in a system with such spread-spectrum clocking (SSC) may be significantly offset from the nominal design frequency, with the offset varying periodically over time.

In one example embodiment, a method includes generating early and late votes for a clock recovery system. As described above, each early and late vote may be associated with a detected transitional data pattern, where a sample generated by one of samplers 131 and 133 as compared to the detected transitional data pattern to determine if the sample is early or late. The method further includes generating a first early-late vote measurement reflective of an imbalance between early and late votes that are generated during a first time interval. The method further includes generating a second early-late vote measurement reflective of an imbalance between early and late votes generated during a second time interval. The method further includes comparing the first and the second early-late vote measurements and outputting a CDR-lock signal at least in part responsive to determining that the first and the second early-late vote measurements are within a predetermined threshold.

In some embodiments, the first and second time intervals may be determined by a predetermined number of signaling intervals. In such embodiments, generating the first and second early-late vote measurement may include normalizing the early and late votes generated during the first and second time intervals respectively by the predetermined number of signaling intervals that define the first time interval. Normalizing the early and late votes generated during the first and second time interval may include dividing at least one of (i) the early votes (ii) the late votes and (iii) a difference between the early and the late votes by a total number of early and late votes generated during the first and second time interval.

In at least one alternative embodiment, the first and second time intervals may be determined by a predetermined number of consecutively-generated early and late votes generated from different portions of the data stream. Such embodiments may directly calculate the first and second early-late vote measurements without normalizing as described above. If the total number of early-late votes detected is the same for the first and second time intervals, the CDR-lock detection circuit may be configured to compare at least one of (i) early votes generated in the first and second time intervals, (ii) late votes generated in the first and second time intervals, and (iii) a difference between early and late votes generated in the first and second time intervals.

In some embodiments, the first and second time intervals are separated by a third time interval. Separating the first and second time intervals with the third time interval allows for the first and second early-late vote measurements to be taken at different points during the data stream, facilitating a more accurate representation of the data stream as a whole.

Figure 4:
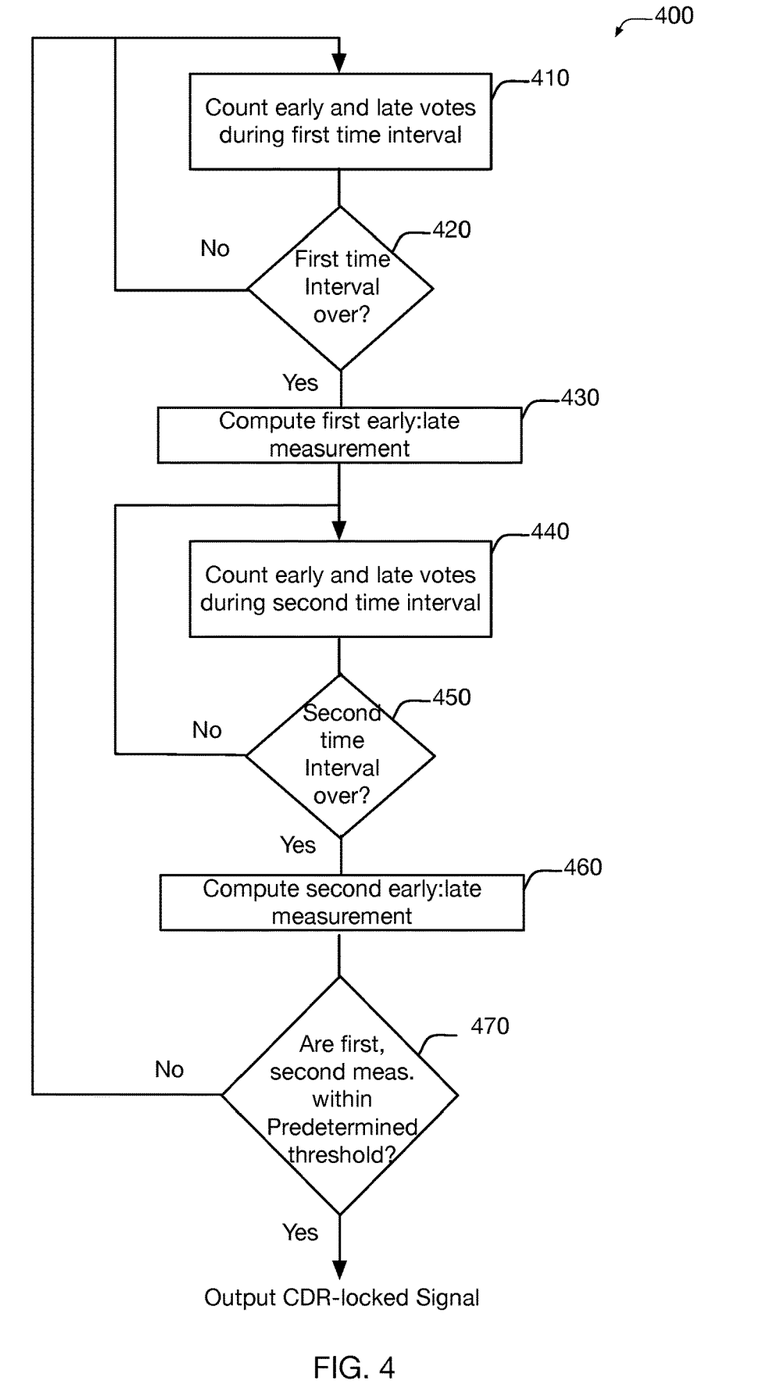
FIG. 4 is a flowchart of a method 400, in accordance with some embodiments.

As illustrated by the flow chart of FIG. 4, early and late (i.e. clock edge before receive data transmission, clock edge after receive data transmission on qualified data patterns) phase error indications may be counted 410 separately by a early phase counter and a late phase counter, obtaining a first vote count of early and late volts over this first time interval. The first time interval may be determined by counting the number of receive unit intervals, by timing a duration, or by the number of phase error indications obtained. A first early-late vote measurement is determined 430 when the first time interval is over 420, which is reflective of an imbalance between early and late votes counted during this first measurement interval. In embodiments described herein, early-late vote "measurements" may also be referred to as "ratios", however such measurements and ratios are termed to reflect the imbalance between early and late votes being accumulated in a given time period. In some embodiments, the "measurements" or "ratios" may correspond to a calculated difference in early votes to late votes, while other embodiments may determine such measurements e.g., by analyzing the number of early (or late) votes accumulated relative to a total number of early and late votes accumulated. Further embodiments might store early and late votes separately and perform a ratiometric division between the two to determine the early-late vote measurements.

The measurement process is repeated for a second time interval, obtaining a second vote count 440 of early and late votes over this second time interval, and a second early-late vote measurement is determined 460 when the second time interval is over 450. In some embodiments, the first and second time intervals are separated by a third time interval, helping to eliminate false counts due to asynchronous period ambiguities and other measurement anomalies as previously described. Furthermore, the first and second early-late vote measurements correspond are associated with different portions of the data stream, and separating them by the third time interval may provide more reliable results as the second early-late vote measurement may not be affected by an anomaly that affected e.g, the first early-late vote measurement.

Figure 5:
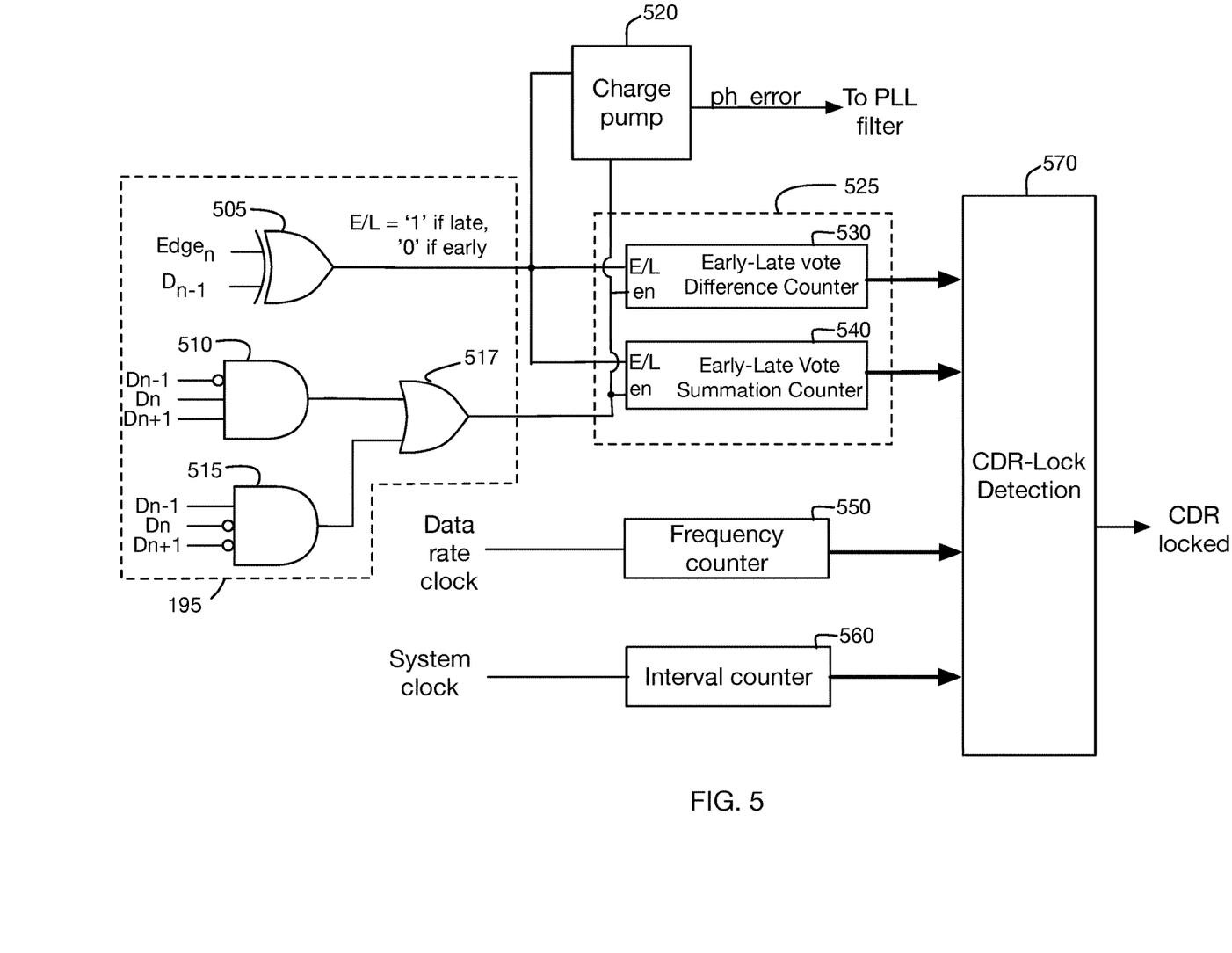
FIG. 5 is a block diagram of an apparatus, in accordance with some embodiments.

If the first and the second early-late vote measurements are comparable within a predetermined threshold 470, a CDR lock signal indicating CDR lock may be output. In some embodiments, frequency counter 550 may assist in outputting the CDR lock signal.

Physical embodiments of this method may be implemented using hardware counters or counters augmented by processing software running on an embedded CPU, management processor, or finite state machine.

In some alternative embodiments, the early-late vote measurement comparison may be made by direct comparison of the first early-late vote measurement and the second early-late vote measurement, subtraction of the first early-late vote measurement and second early-late vote measurement, and taking a ratio of the first early-late vote measurement and the second early-late vote measurement. Utilizing a threshold comparison rather than absolute equivalence accounts for random measurement errors previously described.

A further embodiment compares one or more of the early-late vote measurement against predetermined limits to additionally qualify the measurement validity. Another embodiment compares the early-late vote measurement by determining that a ratio or comparison of the first early-late vote measurement to the second early-late vote measurement is within a predetermined threshold. Another embodiment takes early-late vote measurements by separately determining a difference between early and late votes, either using an up/down counter driven by early and late votes, or by subtraction of the measured early and late values. A further embodiment normalizes at least one of the early vote count, late vote count, and/or early-late ratios relative to the total number of votes during the measurement interval.

In another embodiment, the first measurement interval is separated from the second measurement interval by a third time interval.

A further embodiment performs a clock frequency measurement of at least one of a clock derived from the VCO clock or a receive sampling clock generated by the PLL, using a known reference such as a system clock or time reference. Such embodiments may additionally qualify output of a CDR lock indication based on the clock frequency measurement being within predetermined values, or differing from an expected value by a predetermined threshold amount.

FIG. 5 is a block diagram of an apparatus performing CDR-lock verification, in accordance with some embodiments. As shown, FIG. 5 includes early/late logic 505 configured to provide an early-late vote by determining whether or not the edge sample candidate in the current time interval ($Edge_n$) is the same or different than the data decision generated in the previous time interval ($D_{n-1}$). If $Edge_n$ is equal to Dn–1, then the edge sample is early, while if $Edge_n$ is opposite of $D_{n-1}$ then the edge sample is late. FIG. 3B illustrates such a relationship by illustrating sampling times before 305 and after 315 the "locked" sampling point 310. It should be noted that additional methods of generating early-late votes may be used, including comparing sampler results to data pattern polarity (e.g., an upward transition versus a downward transition).

Figure 6:
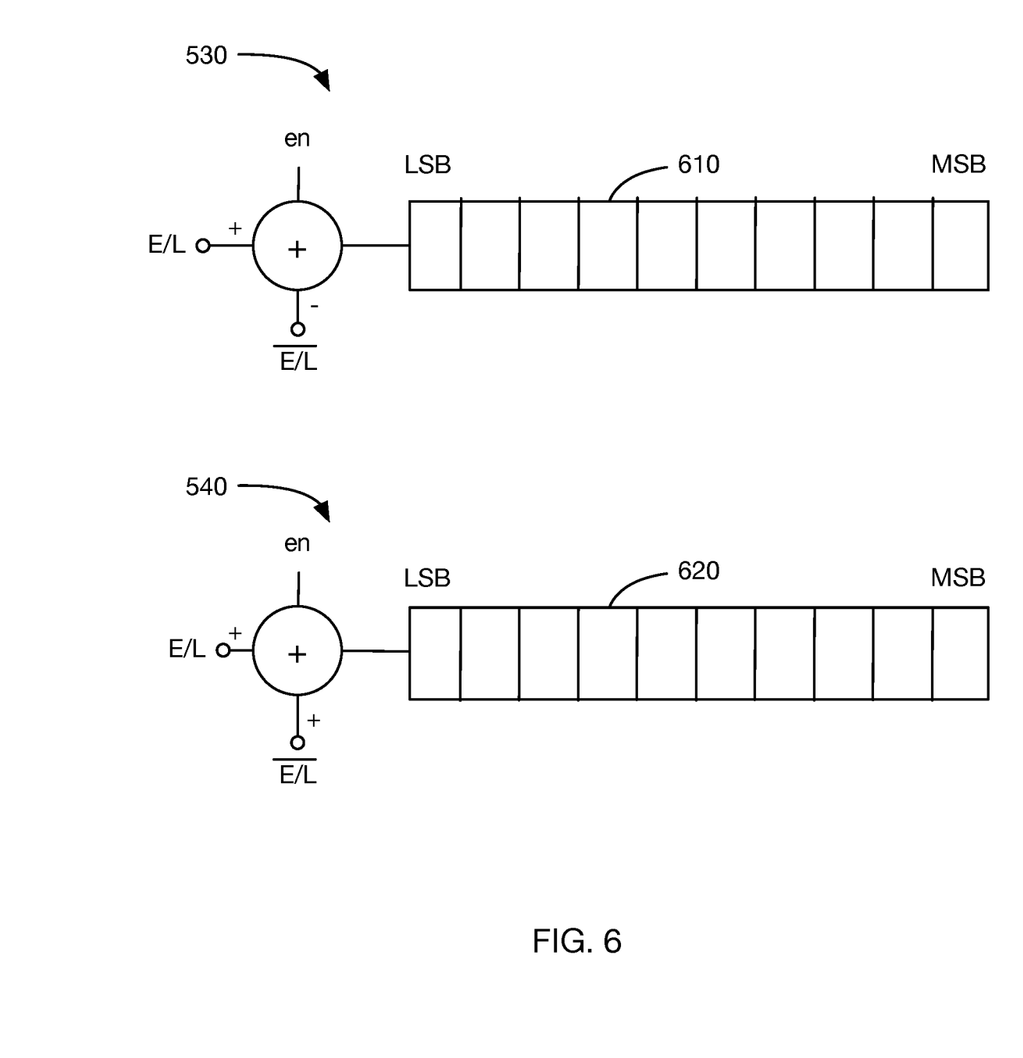
FIG. 6 depicts block diagrams of an early-late vote difference counter and an early-late vote summation counter, in accordance with some embodiments.

FIG. 5 also depicts an accumulator 525 that includes (i) an early-late vote difference counter 530 for determining effective early-late vote measurements between early and late votes generated in a given time interval and (ii) an early-late vote summation counter 540 or determining a total number of early and late votes generated in the given time interval. As shown, both counters 530 and 540 receive early-late votes E/L from early/late logic 505 and are enabled according to a data pattern detection signal generated by pattern detection logic 195 that includes AND gates 510/515 and OR gate 517. The pattern detection logic 195 utilizes specified inverting and non-inverting inputs for AND gates 510/515 receiving three consecutive data decisions $D_{n-1}$, $D_n$, and $D_{n+1}$ to verify that either one of two possible transitional data patterns occurred, thus validating the early-late vote. In FIG. 5, pattern detection logic 195 is searching for transitional data patterns [1,0,0] or [0,1,1], however it should be noted that additional transitional data patterns may be searched utilizing similar configurations of AND gates 510 and 515. The data pattern detection signal thus enables early-late vote difference counter 530 to increment or decrement based on the result of early/late logic 505. FIG. 6 illustrates one particular embodiment of early-late vote difference counter 530. As shown in FIG. 6, early-late vote difference counter 530 is configured to increment the LSB of multi-bit register 610 when E/L is equal to '1' (i.e., $Edge_n$ is late) and to decrement the LSB of multi-bit register 610 when E/L is equal to '0' (i.e., $Edge_n$ is early). The LSB is only adjusted responsive to detection of a valid transitional data pattern as described above via a data pattern detection signal provided to the enable input 'en'. The multi-bit register 610 is updated for the duration of the given time interval, and upon termination of the time interval (e.g., by interval counter 560), the value of multi-bit register 610 corresponds to a difference between the early and late votes generated during the time interval. The imbalance or difference between the early and late votes may reflect the early-late vote ratio of said time interval, although further processing may be included as described in more detail below.

FIG. 6 also includes an exemplary embodiment of early-late vote summation counter 540 that includes multi-bit register 620. Early-late vote summation counter 540 may operate in a similar manner as the early-late vote difference counter 530, however, multi-bit register 620 is always incremented regardless of the value of the early-late vote E/L, where each incremental operation occurs responsive to detection of a valid transitional data pattern as described above. Thus, upon termination of the time interval, the value of multi-bit register 620 corresponds to a total number of early and late votes generated during the time interval, and the value may be transferred to another multi-bit register in CDR-lock detection circuit 570. In some embodiments, the time interval may correspond to a predetermined number of signaling intervals using e.g., interval counter 560. Alternatively, the time interval may be determined by a predetermined number of early and late votes generated in a set of consecutive transitional signaling intervals (i.e., signaling intervals associated with one of the aforementioned transitional data patterns, such signaling intervals only being separated by signaling intervals for which there is not a transition). In such embodiments interval counter 560 may be omitted, and once early-late vote summation counter 540 reaches the predetermined number of early and late votes generated in the set of consecutive transitional signaling intervals, the value of early-late vote difference counter 530 may be stored in CDR-lock detection for determination of the CDR-lock signal.

The multi-bit counters 530 and 540 are shown as incrementing or decrementing according to active high inputs (as indicated with non-inverted inputs for E/L=1='late' and inverted inputs for E/L=0='early'). However, similar active low input counters may be used, and the embodiment of FIG. 6 should not be considered limiting.

It should be noted that early-late difference counter 530 may operate in alternative ways while still maintaining information reflective of the ratio or imbalance of early votes to late votes generated in the time interval. For example, early-late vote difference counter 530 may count only early votes or only late votes. As early-late vote summation counter 540 maintains a count of the total number of early and late votes (i.e., a count of valid transitional data patterns during which valid early-late votes are generated), then the early-late vote measurement for the time interval can be determined by taking the ratio of the number of early votes to the total number of early and late votes (or the number of late votes to the total number of early and late votes).

Qualified clock edge samples as determined by pattern detection logic 195 are processed by Early/late logic 505, producing pulses corresponding to each early or late phase error detected. As shown, the edge sample candidate $Edge_n$ is compared to the data decision generated in the preceding (i.e., n−1) signaling interval $D_{n-1}$ to determine if $Edge_n$ is early or late. In some embodiments, other early/late logic 505 may compare the value of $Edge_r$, (0 or 1) to the polarity of the transitional data pattern used to qualify the sample (i.e. whether the trajectory was [1, 0, 0] or [0, 1, 1]).

Charge pump 520 receives, at an enabling input, the transitional data pattern verification signal from pattern detection logic 195 and converts the early-late votes into incremental pump-up and pump-down adjustments to the VCO. As mentioned above, an imbalance in the magnitude of pump up and pump down signal from the charge pump may result in the average number of early votes to late votes to be imbalanced.

As described above, after termination of the respective time intervals, the values of the early-late vote difference counter 530 and, in some cases, the early-late vote summation counter 540, may be transferred to multi-bit registers within CDR-lock detection circuit 570. The CDR-lock detection circuit 570 may include additional logic and processing means (such as an on-chip or off-chip processor configurable and programmable for executing various calculations of stored data) for calculating and comparing the first and second early-late vote measurements generated in the first and second time intervals. Furthermore, incrementing frequency counter 550 clocked by a data rate clock (or fractional division derived from that clock) during that measurement interval allows the data rate frequency to be measured as well.

In a first embodiment, the first and second time intervals may be defined by a predetermined number of consecutive signaling intervals in the data stream. In such embodiments, the total number of early and late votes generated in the first and second time intervals may be different, and thus CDR-lock detection circuit 570 may normalize the value of early-late vote difference counter 530. In one particular embodiment, CDR-lock detection circuit 570 normalizes the value of early-late vote difference counter 530 by the total number of early and late votes validated in the time interval e.g., by a division. The result for each of the time intervals may subsequently stored in respective multi-bit registers for subsequent comparison.

In a second embodiment, the first and second time intervals may be defined by a set of consecutive transitional signaling intervals (i.e., a predetermined number of early and late votes generated over a consecutive portion of the data stream). In such an embodiment, normalization may not be needed as the first and second time intervals will be defined by the same number of early and late votes. In such embodiments, CDR-lock detection circuit 570 may perform a direct comparison of the values generated by early-late vote difference counter 530 in the first and second time intervals.

The CDR-lock detection circuit 570 may include logic including e.g., XOR gates to compare the multi-bit registers containing the first and second early-late vote measurements. In some embodiments, the CDR-lock detection circuit 570 performs a bit-wise comparison of a set of most-significant-bits (MSBs) of the multi-bit registers, where a set of least-significant-bits (LSBs) corresponds to the predetermined threshold. For example, if the first and second early-late vote measurements correspond to 16-bit values, one embodiment may compare the 13 MSBs between the first and second early-late vote measurements, while the 3 LSBs correspond to so-called "don't cares", setting the predetermined threshold between the first and second early-late vote measurements.

This partitioning between hardware and software functions in CDR-lock detection circuit 570 is purely for descriptive convenience, without implying limitation.

In some embodiments, the system clock may include a spread spectrum clocking (SSC) mode of operation. In such embodiments, the frequency of the data rate clock and the data stream may periodically shift, e.g., on the order of several hundred parts per million (ppm) over the course of e.g., a 33 us period (i.e., a modulation frequency of 30-33 kHz). Thus, an imbalance between early and late votes generated while the frequency of the data rate clock is shifting may be expected. Such numeric examples should not be considered limiting. In such embodiments, the frequency shift of the data rate clock may be associated with an imbalance between early and late votes generated by early/late logic 510. In some such embodiments, the early-late vote measurements taken e.g., during timer intervals wherein the frequency of the data rate clock is increasing may be similar. In such embodiments, the predetermined threshold may account for discrepancies in the early-late vote measurements generated during time intervals occurring at different frequencies of the data rate clock. Furthermore, if the first time interval occurs while the frequency of the data rate clock is increasing while the second time interval occurs while the frequency of the data rate clock is decreasing, the early-late vote measurements may be different yet related. For example, the first early-to-late vote measurement during the first time interval may deviate from a 50-50 ratio by an amount in a first direction, while the second early-to-late vote measurement during the second time interval may deviate from the 50-50 ratio by the same amount in the opposite direction. In some such embodiments, the first and second early-to-late vote measurements may be compared by determining the percentages above and below 50-50 and comparing them and determining whether or not the comparison is within the predetermined threshold. In other words, the number of early votes to late votes while the frequency of the data rate clock is increasing may be the inverse or reciprocal of the number of early votes to late votes while the frequency of the data rate clock is decreasing.

We claim:

1. A method comprising:
sampling a data signal using a pair of samplers having decision thresholds corresponding to speculative decision feedback equalization (DFE) terms, responsively selecting an output of the pair of samplers as a data decision based on a prior data decision, and storing the data decision in a data history buffer;
detecting a transitional data pattern from data decision sequences in the data history buffer, and responsively selecting an output from another of the pair of samplers as an early-late vote in the data signal;
generating a first early-late vote measurement reflective of an imbalance between the early and late votes that are generated during a first time interval;
generating a second early-late vote measurement reflective of an imbalance between the early and late votes that are generated during a second time interval;
comparing the first and the second early-late vote measurements; and
outputting a clock and data recovery (CDR)-lock signal at least in part responsive to determining that the first and the second early-late vote measurements are within a predetermined threshold.

2. The method of claim 1, wherein durations of the first and second time intervals correspond to a predetermined number of early and late votes detected in the data stream.

3. The method of claim 1, wherein durations of the first and the second time intervals correspond to a predetermined number of signaling intervals.

4. The method of claim 3, wherein generating the first early-late vote measurement comprises normalizing at least one of (i) the early votes (ii) the late votes and (iii) a difference between the early and late votes that are generated during the first time interval by a total number of the early and late votes generated during the first time interval.

5. The method of claim 1, wherein comparing the first and second early-late vote measurements comprises determining that a product of a ratio of the first and the second early-late vote measurements is within the predetermined threshold.

6. The method of claim 1, wherein comparing the first and second early-late vote measurements comprises determining that a ratio of the first and the second early-late vote measurements is within the predetermined threshold.

7. The method of claim 6, wherein the first and second early-late vote measurements are accumulated in respective registers, and wherein determining that the ratio of the first and the second early-late vote measurements is within the predetermined threshold comprises performing a logical exclusive OR (XOR) comparison of the first and second early-late vote measurements accumulated in the respective registers.

8. The method of claim 7, wherein the predetermined threshold corresponds to one or more LSBs of the registers associated with "don't care" results.

9. The method of claim 1, wherein the imbalance between early and late votes generated during the first and second time intervals corresponds to a periodic shift in frequency of a spread-spectrum data sampling clock.

10. The method of claim 9, wherein the early and late votes control pump-up and pump-down signals of a charge pump, and wherein magnitudes for the pump-up and pump-down signals of the charge pump are different.

11. An apparatus comprising:
a pair of samplers having decision thresholds corresponding to speculative decision feedback equalization (DFE) terms, the pair of samplers configured to sample a data signal and to responsively generate respective sampler outputs;
a selection circuit configured to select one of the sampler outputs as a data decision based on a prior data decision;
a data history buffer configured to store each data decision output from the selection circuit;
a data pattern detection circuit configured to detect a transitional data pattern from data decision sequences in the data history buffer, and to responsively provide another of the sampler outputs to an accumulator as an early vote or a late vote in the data signal
the accumulator configured to generate first and second early-late vote measurements reflective of an imbalance between the early and late votes that are generated during first and second time intervals, respectively; and
a clock and data recovery (CDR)-lock detection circuit configured to compare the first and the second early-late vote measurements, and to output a CDR-lock signal at least in part responsive to determining that the first and the second early-late vote measurements are within a predetermined threshold.

12. The apparatus of claim 11, further comprising a counter configured to increment responsive to selection of each early vote and late vote, and wherein durations of the first and second time intervals correspond to a predetermined number of detected early and late votes.

13. The apparatus of claim 11, further comprising a counter configured to count signaling intervals, and wherein durations of each of the first and the second time intervals corresponds to a predetermined number of signaling intervals.

14. The apparatus of claim 13, wherein the accumulator is configured to generate the first early-late vote measurement comprises normalizing at least one of (i) the early votes (ii) the late votes and (iii) a difference between the early and late votes that are generated during the first time interval by a total number of the early and late votes generated during the first time interval.

15. The apparatus of claim 11, wherein the CDR-lock detection circuit is configured to compare the first and second early-late vote measurements to determine that a ratio of the first and the second early-late vote measurements is within the predetermined threshold.

16. The apparatus of claim 15, wherein the accumulator comprises registers for storing the first and second early-late vote measurements, and wherein the CDR-lock detection circuit comprises logical exclusive OR (XOR) circuits configured to form a logical XOR comparison of the first and second early-late vote measurements accumulated in the respective registers to determine that the ratio of the first and the second early-late vote measurements is within the predetermined threshold.

17. The apparatus of claim 16, wherein the predetermined threshold corresponds to one or more LSBs of the registers associated with "don't care" results.

18. The apparatus of claim 11, wherein the imbalance between early and late votes generated during the first and second time intervals corresponds to a periodic frequency shift in a spread-spectrum data sampling clock.

19. The apparatus of claim 11, wherein the CDR-lock detection circuit is further configured to compare the first and second early-late vote measurements to determine that a product of a ratio of the first and the second early-late vote measurements is within the predetermined threshold.

20. The apparatus of claim 11, early and late votes control pump-up and pump-down signals of a charge pump, and wherein the imbalance between early and late votes generated during the first and second time intervals is associated with magnitudes for the pump-up and pump-down signals of the charge pump being different.

* * * * *